US012002704B2

(12) United States Patent
Kashiwagi et al.

(10) Patent No.: US 12,002,704 B2
(45) Date of Patent: Jun. 4, 2024

(54) SUBSTRATE HOLDING APPARATUS, SUBSTRATE PROCESSING APPARATUS HAVING SUBSTRATE HOLDING APPARATUS, AND SUBSTRATE PROCESSING METHOD

(71) Applicant: EBARA CORPORATION, Tokyo (JP)

(72) Inventors: Makoto Kashiwagi, Tokyo (JP); Manao Hoshina, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 1141 days.

(21) Appl. No.: 16/168,301

(22) Filed: Oct. 23, 2018

(65) Prior Publication Data

US 2019/0131166 A1    May 2, 2019

(30) Foreign Application Priority Data

Oct. 27, 2017    (JP) .................................. 2017-208327

(51) Int. Cl.
*H01L 21/687*    (2006.01)
*B24B 37/10*    (2012.01)
(Continued)

(52) U.S. Cl.
CPC ...... *H01L 21/68764* (2013.01); *B24B 37/105* (2013.01); *B24B 41/067* (2013.01);
(Continued)

(58) Field of Classification Search
CPC ......... H01L 21/68764; H01L 21/67706; H01L 21/68728; H01L 21/68792; B24B 37/105; G03F 7/707; G03F 7/70758
See application file for complete search history.

(56) References Cited

U.S. PATENT DOCUMENTS

| 2,614,369 A | * | 10/1952 | Robins | B24B 23/046 |
| | | | | 451/356 |
| 3,978,622 A | * | 9/1976 | Mazur | B24B 37/102 |
| | | | | 451/270 |

(Continued)

FOREIGN PATENT DOCUMENTS

| CN | 107104074 A | 8/2017 |
| JP | H05-028760 A | 7/1993 |

(Continued)

OTHER PUBLICATIONS

European Patent Application No. 18202401.8; Extended Search Report; dated Apr. 1, 2019; 9 pages.

*Primary Examiner* — Lee D Wilson
*Assistant Examiner* — Sukwoo James Chang
(74) *Attorney, Agent, or Firm* — BakerHostetler

(57) ABSTRACT

A substrate holding apparatus which can enhance the efficiency of processing of a substrate, such as a wafer, is disclosed. The substrate holding apparatus for holding a substrate and rotating the substrate, includes: rollers capable of contacting a periphery of the substrate; a roller rotating mechanism configured to rotate the rollers; and eccentric shafts coupling the rollers and the roller rotating mechanism, the eccentric shafts having first shaft portions and second shaft portions, the second shaft portions being eccentric relative to the first shaft portions, the first shaft portions being secured to the roller rotating mechanism, and the rollers being secured to the second shaft portions, respectively.

6 Claims, 15 Drawing Sheets

(51) Int. Cl.
*B24B 41/06* (2012.01)
*G03F 7/00* (2006.01)
*H01L 21/677* (2006.01)

(52) U.S. Cl.
CPC .......... *G03F 7/707* (2013.01); *G03F 7/70758* (2013.01); *H01L 21/67706* (2013.01); *H01L 21/68728* (2013.01); *H01L 21/68792* (2013.01)

(56) References Cited

U.S. PATENT DOCUMENTS

| | | | |
|---|---|---|---|
| 5,566,466 A * | 10/1996 | Hearne | B25B 5/147 34/58 |
| 5,933,902 A * | 8/1999 | Frey | B08B 1/04 15/97.1 |
| 6,413,156 B1 | 7/2002 | Shimizu et al. | |
| 6,616,509 B1 * | 9/2003 | Frost | B24D 13/02 451/41 |
| 2003/0104698 A1 | 6/2003 | Taniguchi et al. | |
| 2005/0159089 A1 | 7/2005 | Horiguchi et al. | |
| 2007/0226992 A1 | 10/2007 | Kaneko et al. | |
| 2008/0017225 A1 * | 1/2008 | Randhawa | H01L 21/67057 134/140 |
| 2008/0229526 A1 | 9/2008 | Hu et al. | |
| 2011/0168214 A1 | 7/2011 | Kaneko et al. | |
| 2013/0213437 A1 | 8/2013 | Ishii et al. | |

FOREIGN PATENT DOCUMENTS

| | | |
|---|---|---|
| JP | H06-150305 A | 5/1994 |
| JP | H07-074133 A | 3/1995 |
| JP | H08-125004 A | 5/1996 |
| JP | H10-315081 A | 12/1998 |
| JP | 2000-077379 A | 3/2000 |
| JP | 2001-308038 A | 11/2001 |
| JP | 2002-329695 A | 11/2002 |
| JP | 2004-342939 A | 12/2004 |
| JP | 2005-205585 A | 8/2005 |
| JP | 2007-294920 A | 11/2007 |
| JP | 2013-172019 A | 9/2013 |
| JP | 2015-088736 A | 5/2015 |
| KR | 10-0746576 B1 | 8/2007 |
| TW | 201529183 A | 8/2015 |
| TW | 201703877 A | 2/2017 |
| WO | WO 2001/074533 A2 | 10/2001 |

* cited by examiner

SUBSTRATE HOLDING APPARATUS, SUBSTRATE PROCESSING APPARATUS HAVING SUBSTRATE HOLDING APPARATUS, AND SUBSTRATE PROCESSING METHOD

CROSS REFERENCE TO RELATED APPLICATION

This document claims priority to Japanese Patent Application Number 2017-208327 filed Oct. 27, 2017, the entire contents of which are hereby incorporated by reference.

BACKGROUND

Devices such as memory circuits, logic circuits and image sensors (e.g. CMOS sensors) are becoming more highly integrated these days. In a process for forming such a device, foreign matters such as fine particles and dust may adhere to the device. Foreign matter adhering to a device can cause a short-circuit between interconnects or a circuit defect. Therefore, in order to enhance the reliability of the device, it is necessary to clean a wafer on which the device is formed to remove the foreign matter on the wafer.

The above-described foreign matters, such as fine particles and dust, may adhere also to a back surface (bare-silicon surface) of a wafer. When such foreign matter adheres to the back surface of a wafer, the wafer may separate from a stage reference surface, or a front surface of the wafer may be inclined with respect to the stage reference surface in an exposure apparatus, resulting in patterning deviation or deviation of focal distance. To prevent such problems, it is necessary to remove foreign matter adhering to a back surface of a wafer.

Japanese Laid-Open Patent Publication No. 2013-172019 discloses a substrate processing apparatus for processing a surface of a substrate by rubbing a scrubbing member against the substrate surface. This substrate processing apparatus is configured to hold a periphery of a substrate with chucks, and to press the scrubbing member against a surface of the substrate while rotating the chucks around the center of the substrate.

SUMMARY OF THE INVENTION

Recently, there is an increasing demand for an apparatus which can more efficiently process an entirety of a substrate surface. Therefore, there is provided a substrate holding apparatus which can enhance the efficiency of processing of a substrate such as a wafer. In addition, there are provided a substrate processing apparatus and a substrate processing method for processing a substrate surface with use of such a substrate holding apparatus.

Embodiments, which will be described below, relate to a substrate holding apparatus for holding and rotating a substrate such as a wafer. The below-described embodiments also relate to a substrate processing apparatus and a substrate processing method for processing a surface of a substrate while rotating the substrate by the substrate holding apparatus.

In an embodiment, there is provided a substrate holding apparatus for holding a substrate and rotating the substrate, comprising: rollers capable of contacting a periphery of the substrate; a roller rotating mechanism configured to rotate the rollers; and eccentric shafts coupling the rollers and the roller rotating mechanism, the eccentric shafts having first shaft portions and second shaft portions, the second shaft portions being eccentric relative to the first shaft portions, the first shaft portions being secured to the roller rotating mechanism, and the rollers being secured to the second shaft portions, respectively.

In an embodiment, the roller rotating mechanism includes motors coupled to the first shaft portions, respectively, and an operation controller configured to rotate the motors at the same speed and in the same phase.

In an embodiment, the substrate holding apparatus further comprises counter weights secured to the eccentric shafts, respectively, each of the counter weights and corresponding one of the rollers being arranged symmetrically with respect to corresponding one of the first shaft portions.

In an embodiment, there is provided a substrate processing apparatus comprising: the substrate holding apparatus described above; and a processing head for bringing a processing tool into contact with a first surface of a substrate to process the first surface.

In an embodiment, there is provided a substrate holding apparatus for holding a substrate and rotating the substrate, comprising: a drive roller capable of contacting a periphery of the substrate; a drive shaft to which the drive roller is secured; an orbital table rotatably supporting the drive shaft; a base plate located away from the orbital table; a first motor secured to the base plate; a first torque transmitting mechanism coupling the first motor and the drive shaft; and a translational rotating mechanism configured to cause the orbital table to make a translational rotating motion.

In an embodiment, the substrate holding apparatus further comprises: a clamp roller capable of contacting the periphery of the substrate; an eccentric shaft rotatably supporting the clamp roller, the eccentric shaft being rotatably supported by the orbital table; a rotary actuator secured to the base plate; and a second torque transmitting mechanism coupling the rotary actuator and the eccentric shaft.

In an embodiment, the substrate holding apparatus further comprises a counter weight secured to the eccentric shaft, wherein the eccentric shaft has a first shaft portion and a second shaft portion, the first shaft portion being coupled to the second torque transmitting mechanism, the second shaft portion being eccentric relative to the first shaft portion, the clamp roller is rotatably coupled to the second shaft portion, and the counter weight and the clamp roller are arranged symmetrically with respect to the first shaft portion.

In an embodiment, the substrate holding apparatus further comprises an operation controller, wherein the translational rotating mechanism includes a main eccentric shaft rotatably coupled to the orbital table, a second motor coupled to the main eccentric shaft, and eccentric joints coupling the orbital table and the base plate, the second motor is secured to the base plate, and the operation controller is configured to independently control a rotational speed of the first motor and a rotational speed of the second motor.

In an embodiment, the translational rotating mechanism has counter weights secured to the eccentric joints, respectively, each of the eccentric joints includes a first joint shaft portion rotatably coupled to the base plate, and a second joint shaft portion rotatably coupled to the orbital table, the second joint shaft portion is eccentric relative to the first joint shaft portion, the second joint shaft portion and corresponding one of the counter weights are arranged symmetrically with respect to the first joint shaft portion, the main eccentric shaft includes a first main shaft portion coupled to the second motor, and a second main shaft portion rotatably coupled to the orbital table, and the second main shaft portion is eccentric relative to the first main shaft portion.

In an embodiment, the first torque transmitting mechanism comprises a universal joint or a magnet gear.

In an embodiment, the second torque transmitting mechanism comprises a universal joint or a magnet gear.

In an embodiment, there is provided a substrate processing apparatus comprising: the substrate holding apparatus described above; and a processing head for bringing a processing tool into contact with a first surface of a substrate to process the first surface.

In an embodiment, there is provided a substrate processing method comprising: bringing rollers into contact with a periphery of a substrate; rotating the rollers about their respective own axes while causing the rollers to make a circular motion, thereby rotating the substrate about an axis of the substrate and causing the substrate to make a circular motion; and bringing a processing tool into contact with the substrate, which is rotating and making the circular motion, to process the substrate.

According to the above-described embodiments, the substrate holding apparatus can rotate a substrate, such as a wafer, about its axis while causing the substrate to make a circular motion. The combination of the circular motion of the substrate and the rotation of the substrate on its axis can increase the speed of the substrate at any point on the surface of the substrate. Therefore, when the processing head is pressed against the surface of the substrate, the relative speed between the processing head and the surface of the substrate can be increased, thereby increasing a processing rate of the substrate.

DESCRIPTION OF EMBODIMENTS

Figure 1:
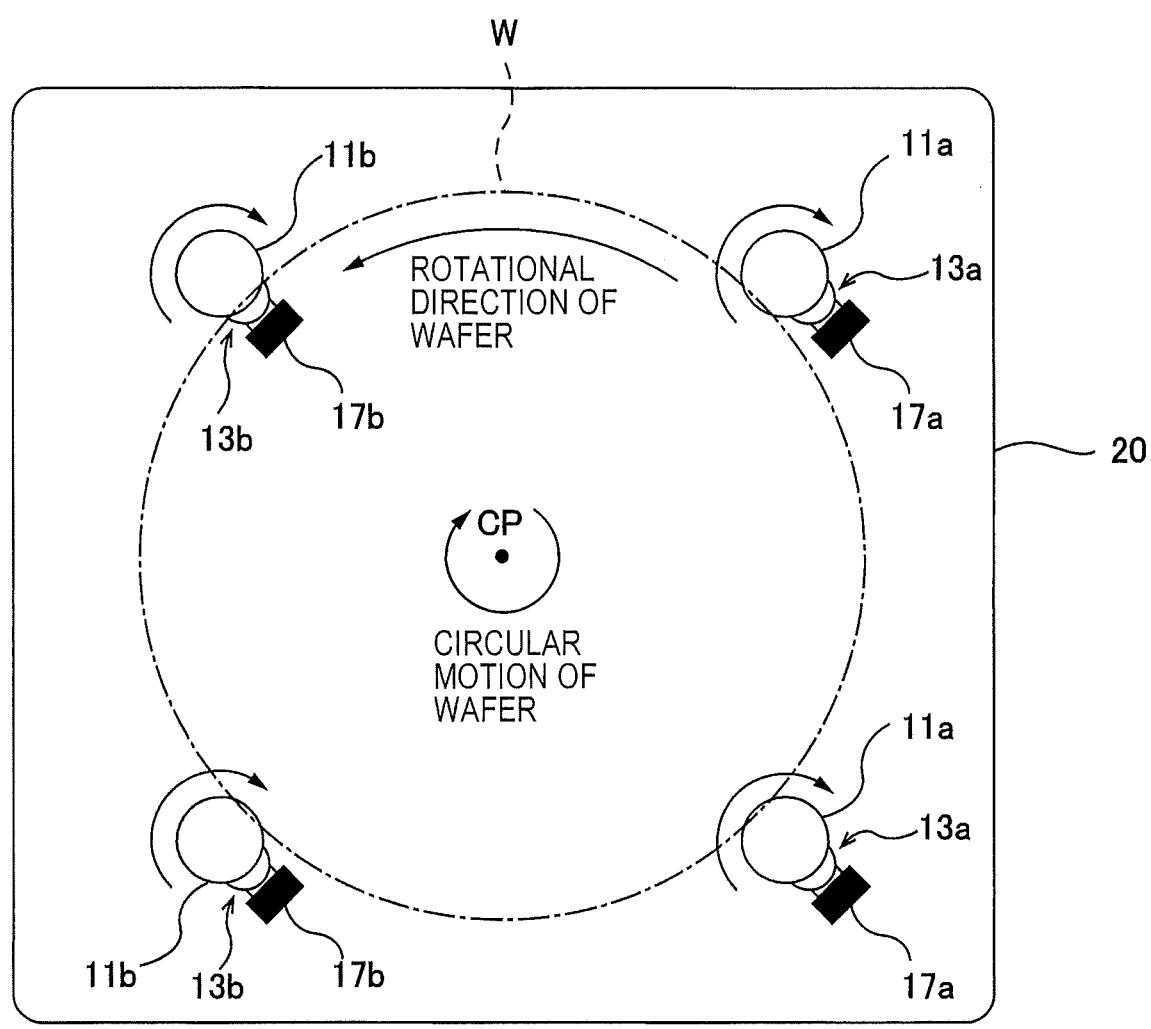
FIG. 1 is a plan view schematically showing an embodiment of a substrate holding apparatus.
Figure 2:
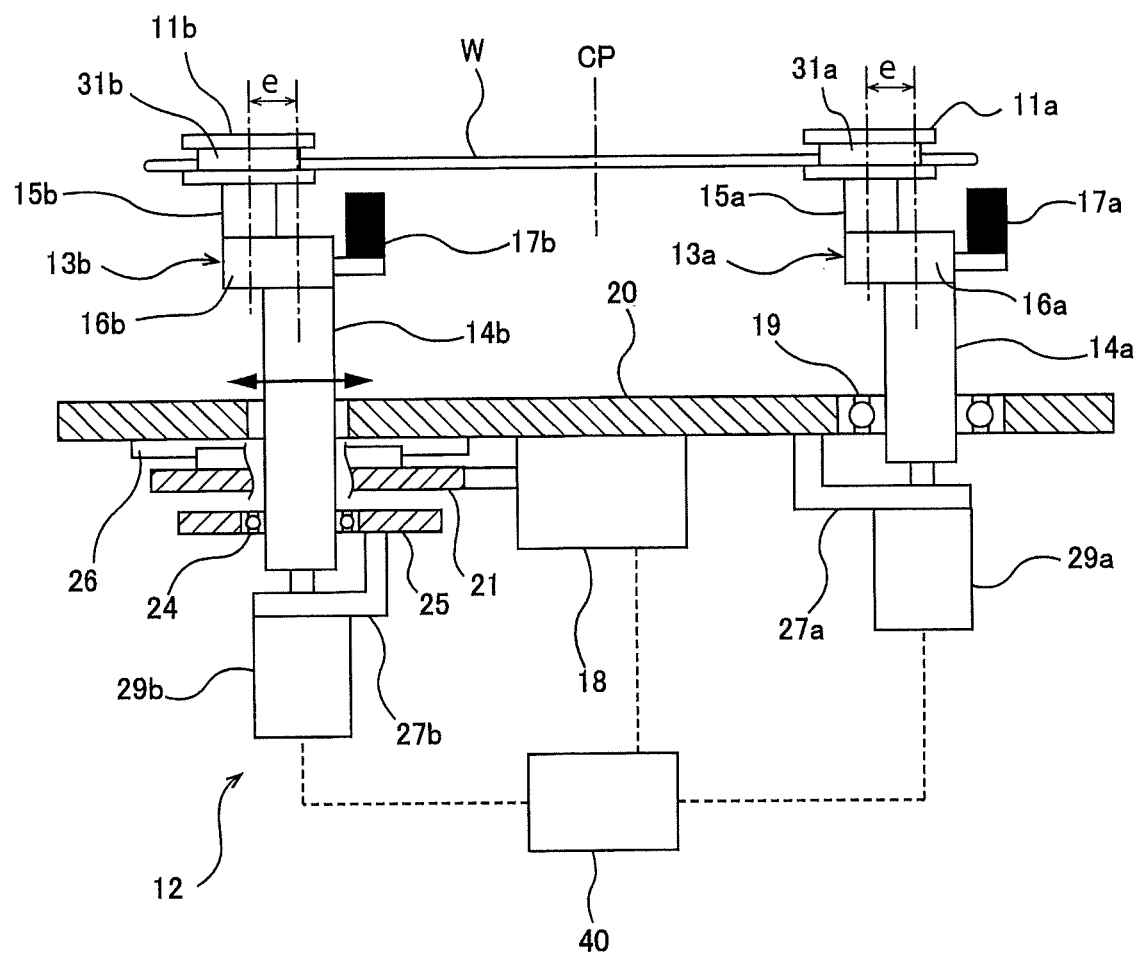
FIG. 2 is a side view of the substrate holding apparatus shown in FIG. 1.
Figure 3:
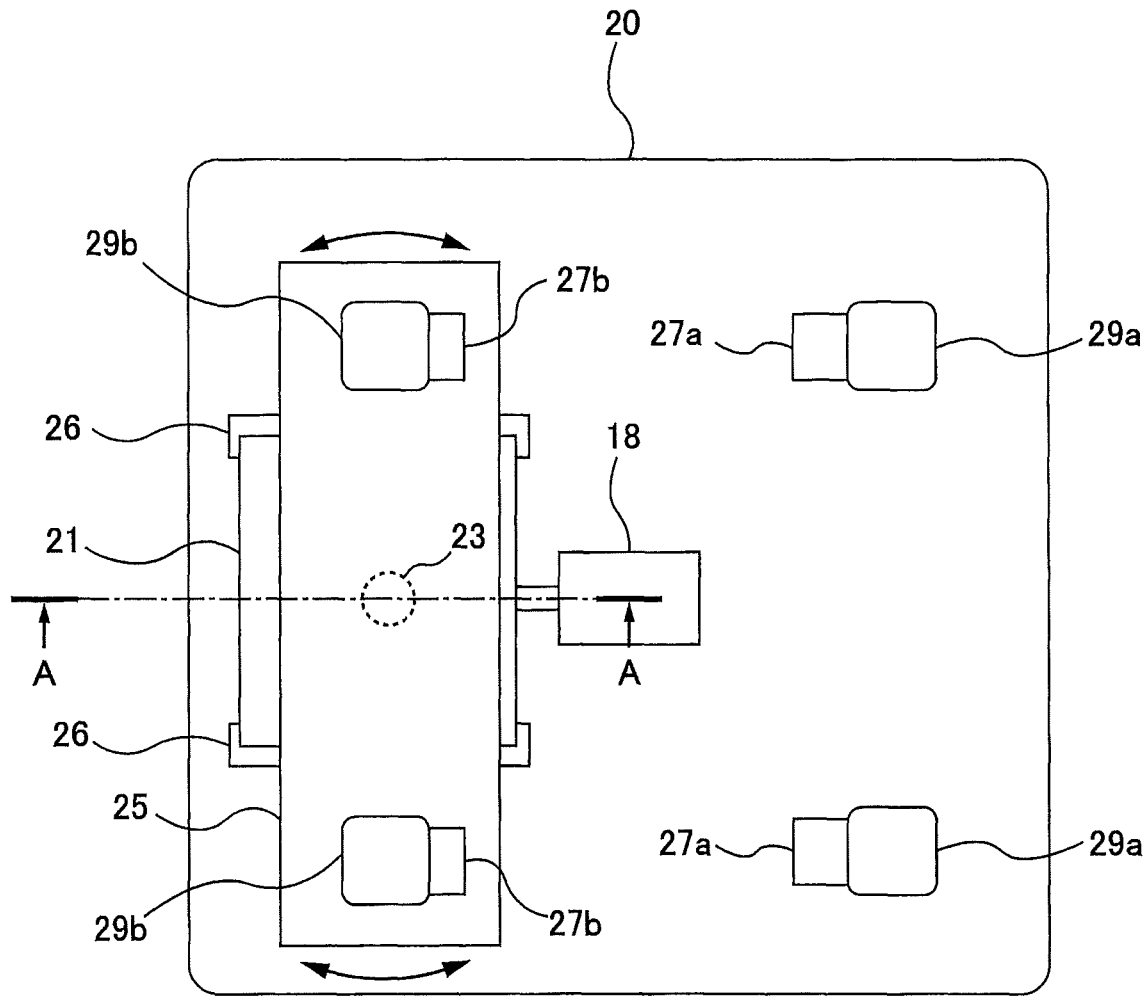
FIG. 3 is a bottom view of the substrate holding apparatus shown in FIG. 1.

Embodiments will now be described with reference to the drawings. FIG. 1 is a plan view schematically showing an embodiment of a substrate holding apparatus, FIG. 2 is a side view of the substrate holding apparatus shown in FIG. 1, and FIG. 3 is a bottom view of the substrate holding apparatus shown in FIG. 1. The substrate holding apparatus of this embodiment is configured to hold and rotate a wafer W which is an exemplary substrate. The substrate holding apparatus includes a plurality of rollers 11a and a plurality of rollers 11b, both of which are capable of contacting a periphery of the wafer W, a roller rotating mechanism 12 for rotating the rollers 11a, 11b, a plurality of eccentric shafts 13a coupling the rollers 11a and the roller rotating mechanism 12 to each other, and a plurality of eccentric shafts 13b coupling the rollers 11b and the roller rotating mechanism 12 to each other. Each roller 11a has a wafer holding surface (or a substrate holding surface) 31a for holding the periphery of the wafer W, and each roller 11b has a wafer holding surface (or a substrate holding surface) 31b for holding the periphery of the wafer W. Each roller 11a and each roller 11b have the same construction and the same size.

The eccentric shafts 13a each have a first shaft portion 14a, and a second shaft portion 15a which is eccentric relative to the first shaft portion 14a. The first shaft portion 14a is secured to the roller rotating mechanism 12, and the roller 11a is secured to the second shaft portion 15a. The eccentric shafts 13b each have a first shaft portion 14b, and a second shaft portion 15b which is eccentric relative to the first shaft portion 14b. The first shaft portion 14b is secured to the roller rotating mechanism 12, and the roller 11b is secured to the second shaft portion 15b.

The roller rotating mechanism 12 includes a plurality of motors 29a coupled respectively to the first shaft portions 14a of the eccentric shafts 13a, a plurality of motors 29b coupled respectively to the first shaft portions 14b of the eccentric shafts 13b, and an operation controller 40 for causing the motors 29a, 29b to rotate at the same speed and in the same phase. Each motor 29a is configured to rotate the eccentric shaft 13a about the first shaft portion 14a, and each motor 29b is configured to rotate the eccentric shaft 13b about the first shaft portion 14b. The motors 29a, 29b are coupled to the operation controller 40.

The operations of the motors 29a, 29b are controlled by the operation controller 40. More specifically, the operation controller 40 starts and stops all the motors 29a, 29b with the same timing, and rotates all the motors 29a, 29b in the same direction. Furthermore, during operation of the motors 29a, 29b, the operation controller 40 synchronizes the rotational speeds and phases of the motors 29a, 29b. Accordingly, all the rollers 11a, 11b rotate in the same direction, at the same rotational speed and in the same phase and, in addition, make a circular motion.

The substrate holding apparatus of this embodiment includes two rollers 11a, two rollers 11b, two eccentric shafts 13a, two eccentric shafts 13b, two motors 29a, and two motors 29b. It is noted, however, that the numbers of these components are not limited to those of this embodiment.

The substrate holding apparatus further includes a base plate 20. The eccentric shafts 13a, 13b extend through the base plate 20. The roller rotating mechanism 12 is disposed at one side of the base plate 20, and the rollers 11a, 11b are disposed at the opposite side of the base plate 20.

A plurality of linear motion guides 26 are secured to a lower surface of the base plate 20, and a movable base 21 is supported by the linear motion guides 26. The linear motion guides 26 are coupled to the movable base 21. The linear motion guides 26 are configured to restrict movement of the movable base 21 to a linear movement in a direction parallel to the lower surface of the base plate 20. An actuator 18 is further secured to the lower surface of the base plate 20. The movable base 21 is coupled to the actuator 18. The actuator 18 is disposed such that it moves the movable base 21 parallel to the base plate 20. The operation of the actuator 18 is controlled by the operation controller 40. The substrate holding apparatus further includes a support plate 25 which rotatably supports the two eccentric shafts 13b via bearings 24. The two motors 29b are secured to the support plate 25 via motor supports 27b.

Figure 4:
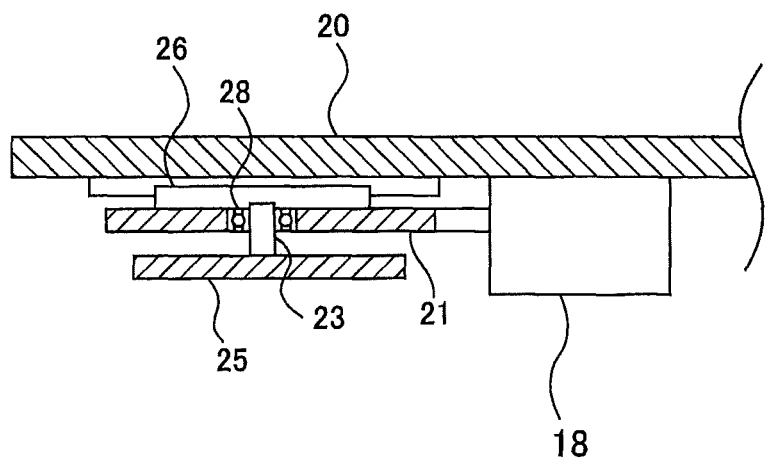
FIG. 4 is a cross-sectional view taken along line A-A of FIG. 3.

FIG. 4 is a cross-sectional view taken along line A-A of FIG. 3. The substrate holding apparatus further includes a pivot shaft 23 secured to the support plate 25. The support plate 25 is disposed below the movable base 21, and the pivot shaft 23 is rotatably supported by a bearing 28, which is fixed to the movable plate 21. The movable base 21 and the support plate 25 are coupled together via the pivot shaft 23, and the support plate 25 is pivotable relative to the movable plate 21. The two eccentric shafts 13b (see FIG. 2), the support plate 25, and the two motors 29b (see FIG. 2) are configured to be capable of pivoting together on the pivot shaft 23. As shown by arrows in FIG. 2, the actuator 18 moves the two eccentric shafts 13b, the support plate 25, the pivot shaft 23, and the two motors 29b, together with the movable base 21, parallel to the base plate 20.

Referring back to FIG. 2, bearings 19 are fixed to the base plate 20. The two eccentric shafts 13a are rotatably supported by the base plate 20 via the bearings 19, respectively. The positions of the eccentric shafts 13a are fixed. The two motors 29a are secured to the base plate 20. More specifically, two motor supports 27a are secured to the lower surface of the base plate 20, and the two motors 29a are secured to the motor supports 27a, respectively. Thus, the two motors 29a are secured to the base plate 20 via the motor supports 27a.

According to the above-described construction, when the two eccentric shafts 13b move in a direction closer to the two eccentric shafts 13a, the wafer W is held by the two rollers 11a and the two rollers 11b. Since the two rollers 11b are pivotable on the pivot shaft 23, the positions of the rollers 11b can be automatically adjusted when the four rollers 11a, 11b are holding the wafer W. The wafer W is released from the two rollers 11a and the two rollers 11b when the two eccentric shafts 13b move in a direction away from the two eccentric shafts 13a. Though the two eccentric shafts 13a and the two eccentric shafts 13b, arranged around the axis CP of the substrate holding apparatus, are provided in this embodiment, the numbers of these components are not limited to those of this embodiment. For example, it is possible to provide one eccentric shaft 13a and two eccentric shafts 13b, arranged around the axis CP at equal intervals, i.e. 120-degree intervals.

The second shaft portion 15a of each eccentric shaft 13a is decentered by a distance e from the first shaft portion 14a. Accordingly, when the motor 29a is in motion, the roller 11a, while rotating about the second shaft portion 15a of the eccentric shaft 13a, makes a circular motion with a radius e. The axis of the roller 11a coincides with the axis of the second shaft portion 15a. Therefore, the roller 11a, while rotating about its axis, makes a circular motion with a radius e around the axis of the first shaft portion 14a.

Similarly, the second shaft portion 15b of each eccentric shaft 13b is decentered by a distance e from the first shaft portion 14b. Accordingly, when the motor 29b is in motion, the roller 11b, while rotating about the second shaft portion 15b of the eccentric shaft 13b, makes a circular motion with a radius e. The axis of the roller 11b coincides with the axis of the second shaft portion 15b. Therefore, the roller 11b, while rotating about its axis, makes a circular motion with a radius e around the axis of the first shaft portion 14b. The circular motion is defined herein as a movement of an object in a circular orbit.

As described above, the operation controller 40 rotates all the motors 29a, 29b at the same speed and in the same phase. Therefore, when the operation controller 40 sets the motors 29a, 29b in motion, the wafer W, held by the rollers 11a, 11b, makes a circular motion with a radius e, while rotating about the axis of the wafer W.

In one embodiment, the roller rotating mechanism 12 may include a plurality of driven pulleys (not shown) secured to the first shaft portions 14a, 14b of the eccentric shafts 13a, 13b, at least one motor (not shown), a drive pulley(s) (not shown) secured to the rotating shaft(s) of the at least one motor, and at least one belt (not shown) riding on the driven pulleys and the drive pulley(s). In this case, all the rollers 11a, 11b rotate at the same speed and in the same phase by the motor(s) to which the drive pulley(s) is secured. Thus, also in this case, when the motor(s), to which the drive pulley(s) is secured, is in motion, the wafer W held by the rollers 11a, 11b makes a circular motion with a radius e while the wafer W is rotating about the axis of the wafer W.

A counter weight 17a and a counter weight 17b are secured to each eccentric shaft 13a and each eccentric shaft 13b, respectively. More specifically, the counter weights 17a, 17b are respectively secured to intermediate shaft portions 16a, 16b that couple the first shaft portions 14a, 14b and the second shaft portions 15a, 15b, respectively. The counter weight 17a and the roller 11a are arranged symmetrically with respect to the first shaft portion 14a. The weight of the counter weight 17a is such that a centrifugal force, which is generated in the radial direction from the first shaft portion 14a toward the roller 11a when the eccentric shaft 13a is rotating about the first shaft portion 14a, is canceled by a centrifugal force acting on the counter weight 17a.

Similarly, the counter weight 17b and the roller 11b are arranged symmetrically with respect to the first shaft portion 14b. The weight of the counter weight 17b is such that a centrifugal force, generated in the radial direction from the first shaft portion 14b toward the roller 11b when the eccentric shaft 13b is rotating about the first shaft portion 14b, is canceled by a centrifugal force acting on the counter weight 17b. Such counter weights 17a, 17b can prevent vibration of the eccentric shafts 13a, 13b due to a weight imbalance during rotation of the eccentric shafts 13a, 13b.

Figure 5A:
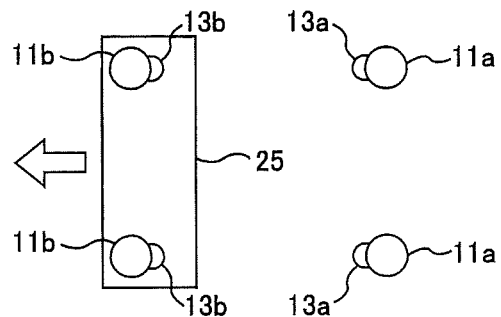
FIGS. 5A, 5B, 5C, 5D are schematic diagrams illustrating the operation of the substrate holding apparatus when receiving a wafer.
Figure 5B:
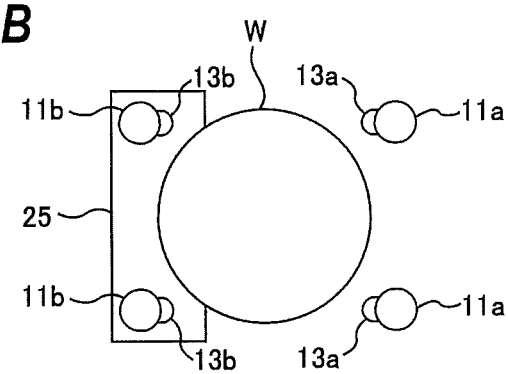
Figure 5C:
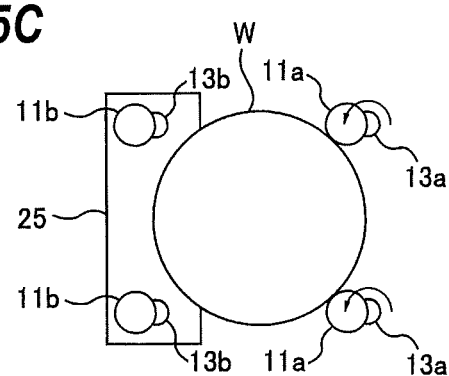
Figure 5D:
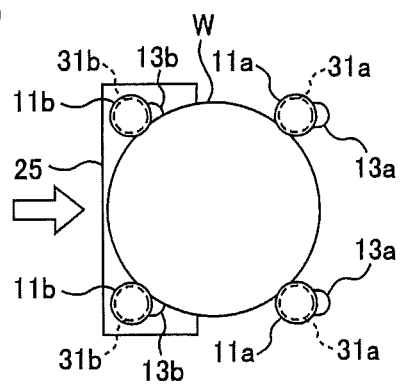

FIGS. 5A through 5D are schematic diagrams illustrating the operation of the substrate holding apparatus when receiving the wafer W. As shown in FIG. 5A, before the substrate holding apparatus receives the wafer W, the actuator 18 (see FIG. 2) is set in motion to move the rollers 11b in a direction away from the rollers 11a. The rollers 11a and the rollers 11b are decentered outward. As shown in FIG. 5B, the wafer W is transported to the substrate holding apparatus by a not-shown transport device. Thereafter, as shown in FIG. 5C, while the wafer W is located between the rollers 11a and the rollers 11b, the eccentric shafts 13a are rotated 180 degrees to decenter the rollers 11a inward. Thereafter, the actuator 18 moves the rollers 11b in a direction closer to the rollers 11a until the rollers 11b come into contact with the wafer W. The periphery of the wafer W is held by the wafer holding surfaces 31a of the rollers 11a and the wafer holding surfaces 31b of the rollers 11b. When the wafer W is to be removed from the substrate holding apparatus, the process steps shown in FIGS. 5A through 5D are performed in the opposite order.

The operation of the substrate holding apparatus, holding the wafer W, is as follows. The operation controller 40 instructs the motors 29a, 29b to rotate the eccentric shafts 13a, 13b in the same direction about the first shaft portions 14a, 14b. The operation controller 40 starts the motors 29a, 29b with the same timing. The operation controller 40 synchronizes the rotational speeds and the phases of all the motors 29a, 29b. The above operation allows the wafer W to rotate about its axis while causing the wafer W to perform a circular motion with a radius e.

The substrate holding apparatus according to this embodiment has a simple construction and yet can rotate the wafer W about its axis while allowing the wafer W to make a circular motion. The combination of the circular motion of the wafer W and the rotation of the wafer W about the axis of the wafer W can increase the speed of the wafer W at any point on the surface of the wafer W. Therefore, when the below-described processing head is pressed against the surface of the wafer W, the relative speed between the processing head and the surface of the wafer W can be increased, thereby increasing a processing rate of the wafer W.

Figure 6:
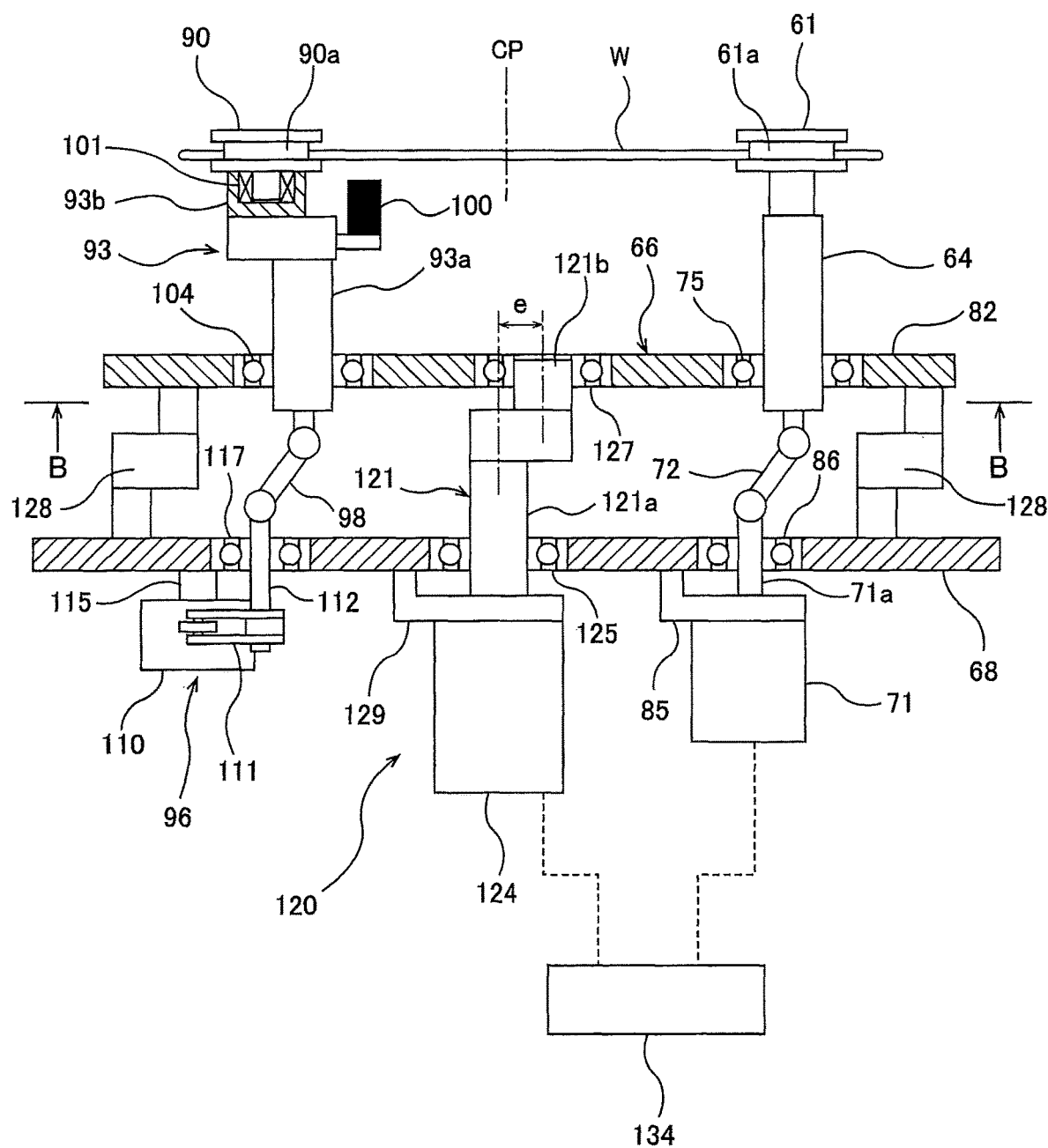
FIG. 6 is a side view showing another embodiment of a substrate holding apparatus.
Figure 7:
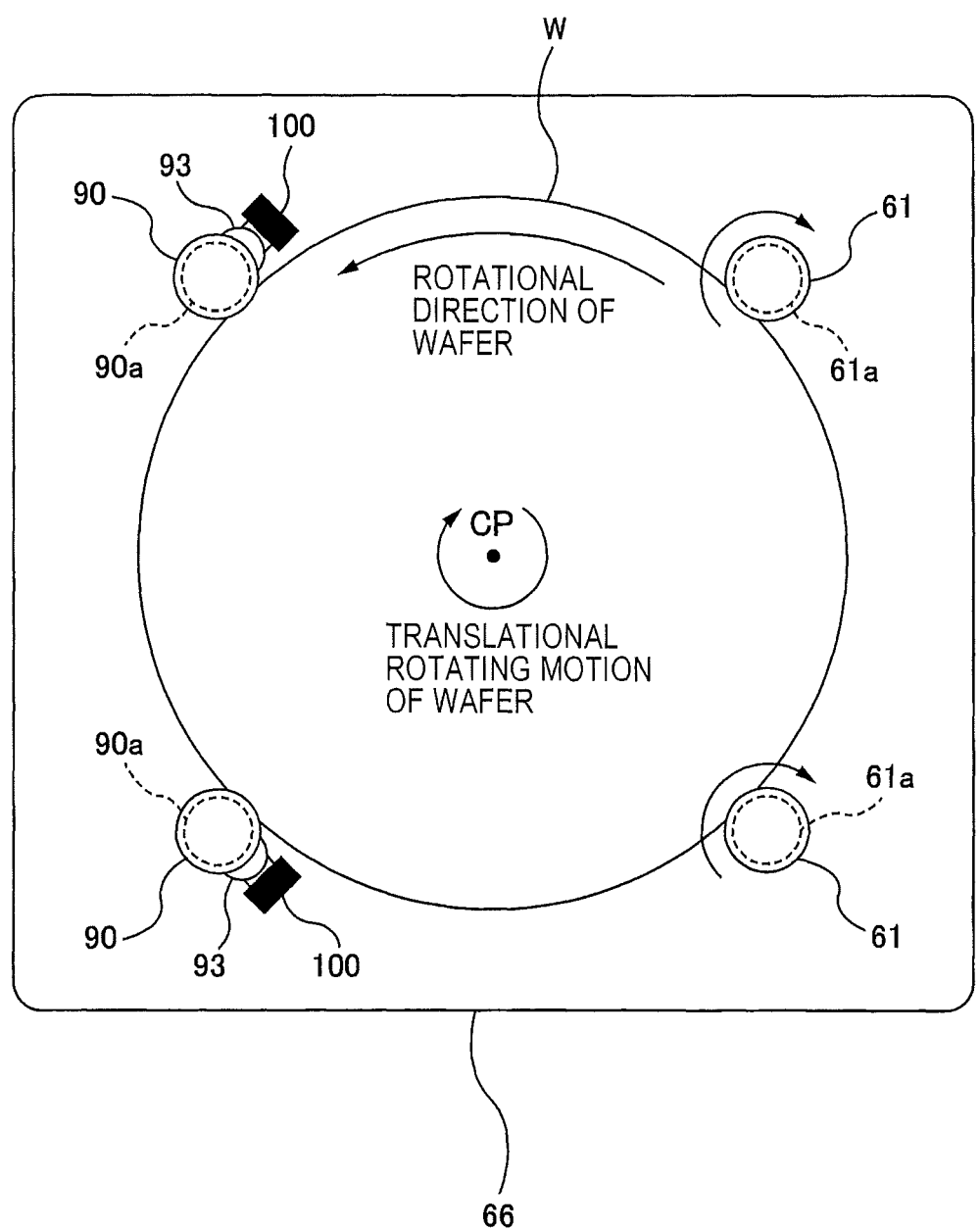
FIG. 7 is a plan view of the substrate holding apparatus shown in FIG. 6.

Another embodiment will now be described. FIG. 6 is a side view showing another embodiment of a substrate holding apparatus, and FIG. 7 is a plan view of the substrate holding apparatus shown in FIG. 6. The substrate holding apparatus of this embodiment includes two drive rollers 61 which are capable of contacting a periphery of a wafer W, two drive shafts 64 to which the two drive rollers 61 are secured respectively, an orbital table 66 which rotatably supports the two drive shafts 64, a base plate 68 arranged away from the orbital table 66, two first motors 71 secured to the base plate 68, and two first universal joints 72 as first torque transmitting mechanisms coupling the two first motors 71 and the two drive shafts 64, respectively. It is to be noted that FIG. 6 only shows one drive roller 61, one drive shaft 64, one first motor 71, and one first universal joint 72.

Though the substrate holding apparatus of this embodiment includes two drive rollers 61, two drive shafts 64, two first motors 71, and two first universal joints 72, the numbers of these components are not limited to those of this embodiment.

Each drive roller 61 has a wafer holding surface (or a substrate holding surface) 61a for holding the periphery of the wafer W. Each drive roller 61 is secured to one end of each drive shaft 64 so that the drive roller 61 and the drive shaft 64 can rotate together about the axis of the drive roller 61. The drive shaft 64 extends perpendicularly to the orbital table 66. The orbital table 66 includes two bearings 75 (only one bearing 75 is shown in FIG. 6) that rotatably support the two drive shafts 64, and a pedestal 82 holding these bearings 75. The pedestal 82 of this embodiment has a plate-like shape, while there is no particular limitation on the shape of the pedestal 82 as long as a sufficient mechanical rigidity is ensured. The drive shafts 64 extend through the orbital table 66, and the other ends of the drive shafts 64 are coupled to one ends of the first universal joints 72, respectively.

In this embodiment, the base plate 68 is located below the orbital table 66. The two first universal joints 72 are arranged between the orbital table 66 and the base plate 68. Each of the first universal joints 72 is an articulated universal joint having a plurality of joints. One end of each first universal joint 72 is coupled to the drive shaft 64, while the other end of the first universal joint 72 is coupled to the shaft 71a of the first motor 71.

The first motors 71 are secured to the base plate 68. More specifically, first motor platforms 85 are secured to the lower surface of the base plate 68, and the first motors 71 are secured to the first motor platforms 85, respectively. Thus, the first motors 71 are secured to the base plate 68 via the first motor platforms 85. The shafts 71a of the first motors 71 are rotatably supported by bearings 86 fixed to the base plate 68. Each shaft 71a may be comprised of a plurality of shafts coupled in tandem by a coupling(s).

When the first motor 71 is in operation, the rotation of the shaft 71a of the first motor 71 is transmitted through the first universal joint 72 to the drive shaft 64, and the drive shaft 64 and the drive roller 61 rotate together about the axis of the drive roller 61.

The substrate holding apparatus further includes two clamp rollers 90 which are capable of contacting the periphery of the wafer W, two eccentric shafts 93 which rotatably support the two clamp rollers 90, two rotary actuators 96 secured to the base plate 68, and two second universal joints 98 as second torque transmitting mechanisms coupling the two rotary actuators 96 and the two eccentric shafts 93, respectively. It is to be noted that FIG. 6 only shows one clamp roller 90, one eccentric shaft 93, one rotary actuator 96, and one second universal joint 98.

Though the substrate holding apparatus of this embodiment includes two clamp rollers 90, two eccentric shafts 93, two rotary actuators 96, and two second universal joints 98, the numbers of these components are not limited to those of this embodiment. Though the two drive shafts 64 and the two eccentric shafts 93, arranged around the axis CP of the substrate holding apparatus, are provided in this embodiment, the numbers of these components are not limited to those of this embodiment.

Each clamp roller 90 has a wafer holding surface (or a substrate holding surface) 90a for holding the periphery of the wafer W. Each eccentric shaft 93 has a first shaft portion 93a coupled to the second universal joint 98, and a second shaft portion 93b which is eccentric relative to the first shaft portion 93a. A counter weight 100 is secured to each of the eccentric shafts 93. The counter weight 100 and the clamp roller 90 are arranged symmetrically with respect to the first shaft portion 93a. The weight of the counter weight 100 is such that a centrifugal force, which acts on the second shaft portion 93b (or the clamp roller 90) by the below-described translational rotating motion, is canceled by a centrifugal force acting on the counter weight 100. The counter weight 100 is provided to stabilize a clamping force of the clamp roller 90 applied to the wafer W during the below-described translational rotating motion, i.e. to prevent a clamping force of the clamp roller 90 applied to the wafer W from fluctuating due to the translational rotating motion.

The clamp rollers 90 are rotatably coupled to the second shaft portions 93b, respectively. More specifically, each of the second shaft portions 93b has a bearing 101 disposed therein, and each clamp roller 90 is rotatably supported by the bearing 101. Such construction enables the clamp rollers 90 to rotate relative to the eccentric shafts 93.

The eccentric shafts 93 are rotatably supported by the orbital table 66. More specifically, the orbital table 66 includes two bearings 104 (only one bearing 104 is shown in FIG. 6) held by the pedestal 82. The first shaft portions 93*a* of the two eccentric shafts 93 are rotatably supported by the bearings 104, respectively. The two second universal joints 98 are located between the orbital table 66 and the base plate 68. Each second universal joint 98 is an articulated universal joint having a plurality of joints. One ends of the second universal joints 98 are coupled to the eccentric shafts 93, while the other ends of the second universal joints 98 are coupled to the rotary actuators 96 secured to the base plate 68.

Each of the rotary actuators 96 includes an air cylinder 110, a crank 111 coupled to the air cylinder 110, and a rotating shaft 112 secured to the crank 111. The air cylinder 110 is rotatably secured via a pivot shaft 115 to the lower surface of the base plate 68. The pivot shaft 115 extends perpendicularly to the base plate 68, and the air cylinder 110 can rotate about the pivot shaft 115 in a direction parallel to the base plate 68.

The rotating shaft 112 is rotatably supported by a bearing 117 fixed to the base plate 68. One end of the rotating shaft 112 is secured to the crank 111, while the other end of the rotating shaft 112 is secured to the second universal joint 98. The rotating shaft 112 may be comprised of a plurality of shafts coupled in tandem by a coupling(s).

Figure 8:
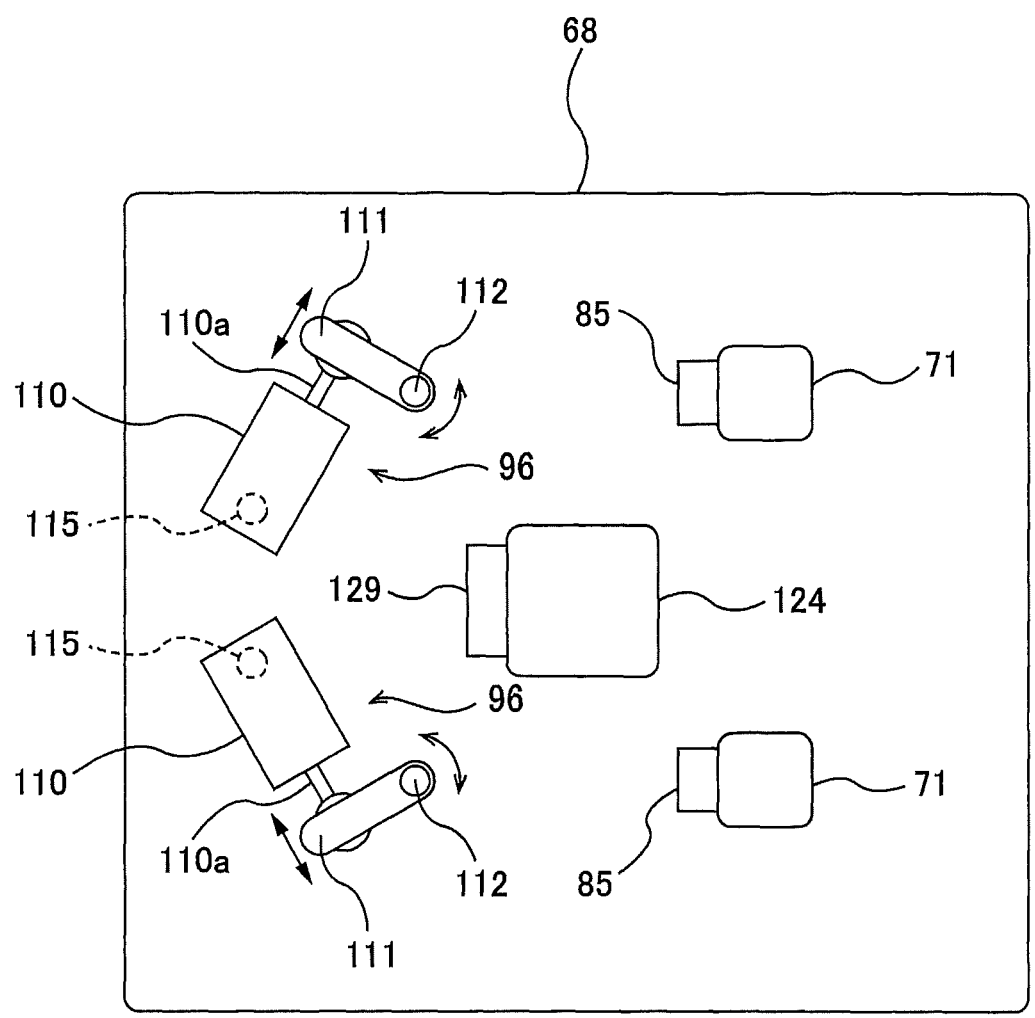
FIG. 8 is a bottom view of the substrate holding apparatus.

FIG. 8 is a bottom view of the substrate holding apparatus. A piston rod 110*a* of the air cylinder 110 is rotatably coupled to an end portion of the crank 111. The crank 111 converts a linear motion of the piston rod 110*a* of the air cylinder 110 into a rotating motion. This rotating motion of the crank 111 rotates the rotating shaft 112.

When the rotary actuator 96 is in motion, the second universal joint 98 (see FIG. 6) rotates by a certain angle. This rotation of the second universal joint 98 rotates the eccentric shaft 93 (see FIG. 6) and, at the same time, causes the clamp roller 90 (see FIG. 6) to make a circular motion. This circular motion of the clamp roller 90 is an arc-like movement of the clamp roller 90 around the axis of the first shaft portion 93*a* (see FIG. 6) of the eccentric shaft 93. In particular, when the rotary actuator 96 rotates the eccentric shaft 93 in one direction, the clamp roller 90 moves in a direction closer to the periphery of the wafer W. When the rotary actuator 96 rotates the eccentric shaft 93 in the opposite direction, the clamp roller 90 moves in a direction away from the periphery of the wafer W.

FIG. 7 illustrates a state of the substrate holding apparatus when the clamp rollers 90 have moved in a direction closer to the periphery of the wafer W, until the wafer holding surfaces 90*a* of the clamp rollers 90 are brought into contact with the periphery of the wafer W. As shown in FIG. 7, when the wafer holding surfaces 90*a* of the clamp rollers 90 are brought into contact with the periphery of the wafer W, the wafer W is held by the two drive rollers 61 and the two clamp rollers 90. When the drive rollers 61 rotate while the periphery of the wafer W is in contact with the drive rollers 61 and the clamp rollers 90, the rotations of the drive rollers 61 are transmitted to the wafer W, whereby the wafer W is rotated about the axis of the wafer W.

Figure 9:
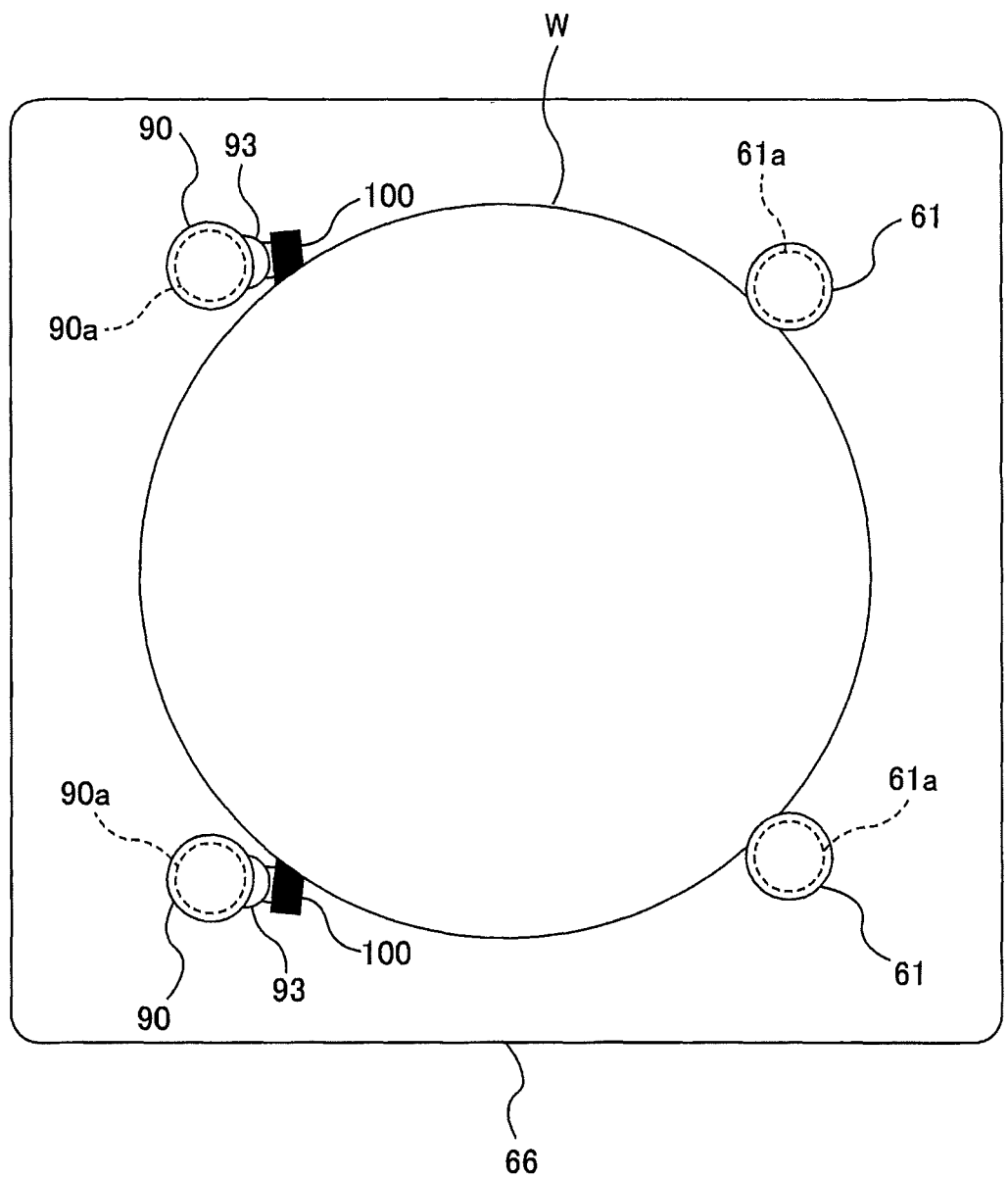
FIG. 9 is a plan view illustrating a state of the substrate holding apparatus when clamp rollers are away from a periphery of a wafer.

The positions of the clamp rollers 90, shown in FIG. 7, are clamping positions where the clamp rollers 90 hold the wafer W. When the rotary actuators 96 (see FIGS. 6 and 8) rotate the eccentric shafts 93 in the opposite direction, the clamp rollers 90 move away from the periphery of the wafer W. FIG. 9 illustrates a state of the substrate holding apparatus when the clamp rollers 90 are away from the periphery of the wafer W. The positions of the clamp rollers 90, shown in FIG. 9, are unclamping positions where the clamp rollers 90 release the wafer W.

As shown in FIG. 6, the substrate holding apparatus further includes a translational rotating mechanism 120 for causing the orbital table 66 to make a translational rotating motion. The translational rotating motion of the orbital table 66 is a circular motion of the orbital table 66 in a circular orbit without rotation of the orbital table 66 itself about the axis of the orbital table 66. This translational rotating motion is an example of a circular motion. The translational rotating mechanism 120 includes a main eccentric shaft 121 rotatably coupled to the orbital table 66, a second motor 124 coupled to the main eccentric shaft 121, and a plurality of eccentric joints 128 coupling the orbital table 66 and the base plate 68.

The main eccentric shaft 121 includes a first main shaft portion 121*a* coupled to the second motor 124, and a second main shaft portion 121*b* rotatably coupled to the orbital table 66. The second main shaft portion 121*b* is decentered by a distance e from the first main shaft portion 121*a*. A bearing 125 is fixed to the base plate 68, and the first main shaft portion 121*a* is rotatably supported by the bearing 125. The orbital table 66 has a bearing 127 fixed to the pedestal 82, and the second main shaft portion 121*b* is rotatably supported by the bearing 127.

The second motor 124 is secured to the base plate 68. More specifically, a second motor platform 129 is secured to the lower surface of the base plate 68, and the second motor 124 is secured to the second motor platform 129. Thus, the second motor 124 is secured to the base plate 68 via the second motor platform 129. When the second motor 124 is in motion, the main eccentric shaft 121 is rotated to cause the orbital table 66, coupled to the second main shaft portion 121*b* of the main eccentric shaft 121, to make a translational rotating motion. In one embodiment, the second motor 124 and the main eccentric shaft 121 may be coupled via a rotation transmitting mechanism (not shown) comprised of, for example, a combination of a belt and pulleys.

When the second motor 124 rotates the main eccentric shaft 121, the orbital table 66 makes a translational rotating motion. Since the drive shafts 64 and the eccentric shafts 93 are supported by the orbital table 66, the drive rollers 61, the clamp rollers 90, the drive shafts 64, the eccentric shafts 93, and the orbital table 66 make a translational rotating motion together. With the translational rotating motion of the drive shafts 64 and the eccentric shafts 93, the wafer W held by the drive rollers 61 and the clamp rollers 90 also makes a translational rotating motion.

The substrate holding apparatus further includes an operation controller 134. The first motors 71 and the second motor 124 are electrically connected to the operation controller 134. The operation controller 134 is configured to be capable of controlling the operation of the first motors 71 and the operation of the second motor 124 independently. More specifically, the operation controller 134 can independently control the start and stop of the first motors 71, the start and stop of the second motor 124, the rotational speed and the rotational direction of the first motors 71, and the rotational speed and the rotational direction of the second motor 124. For example, the operation controller 134 can allow the first motors 71 and the second motor 124 to rotate at the same rotational speed or different rotational speeds. Further, the operation controller 134 can allow the first motors 71 and the second motor 124 to rotate in the same rotational direction or different rotational directions. The above-described operation of the rotary actuators 96 is also controlled by the operation controller 134.

Figure 10:
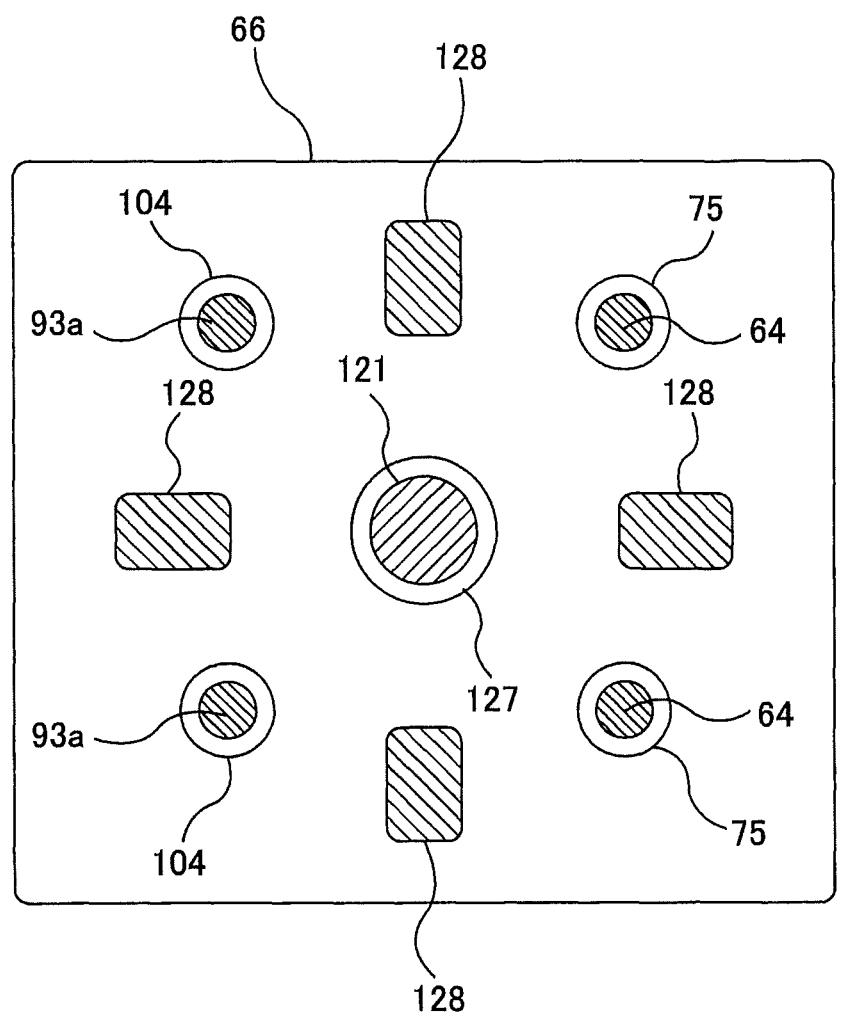
FIG. 10 is a cross-sectional view taken along line B-B of FIG. 6.

The eccentric joints 128 function to keep the orbital table 66 parallel to the base plate 68 while permitting the translational rotating motion of the orbital table 66. While only two eccentric joints 128 are depicted in FIG. 6, at least two eccentric joints 128 are disposed around the main eccentric shaft 121. In this embodiment, four eccentric joints 128 are disposed around the main eccentric shaft 121, as shown in FIG. 10. FIG. 10 is a cross-sectional view taken along line B-B of FIG. 6.

Figure 11:
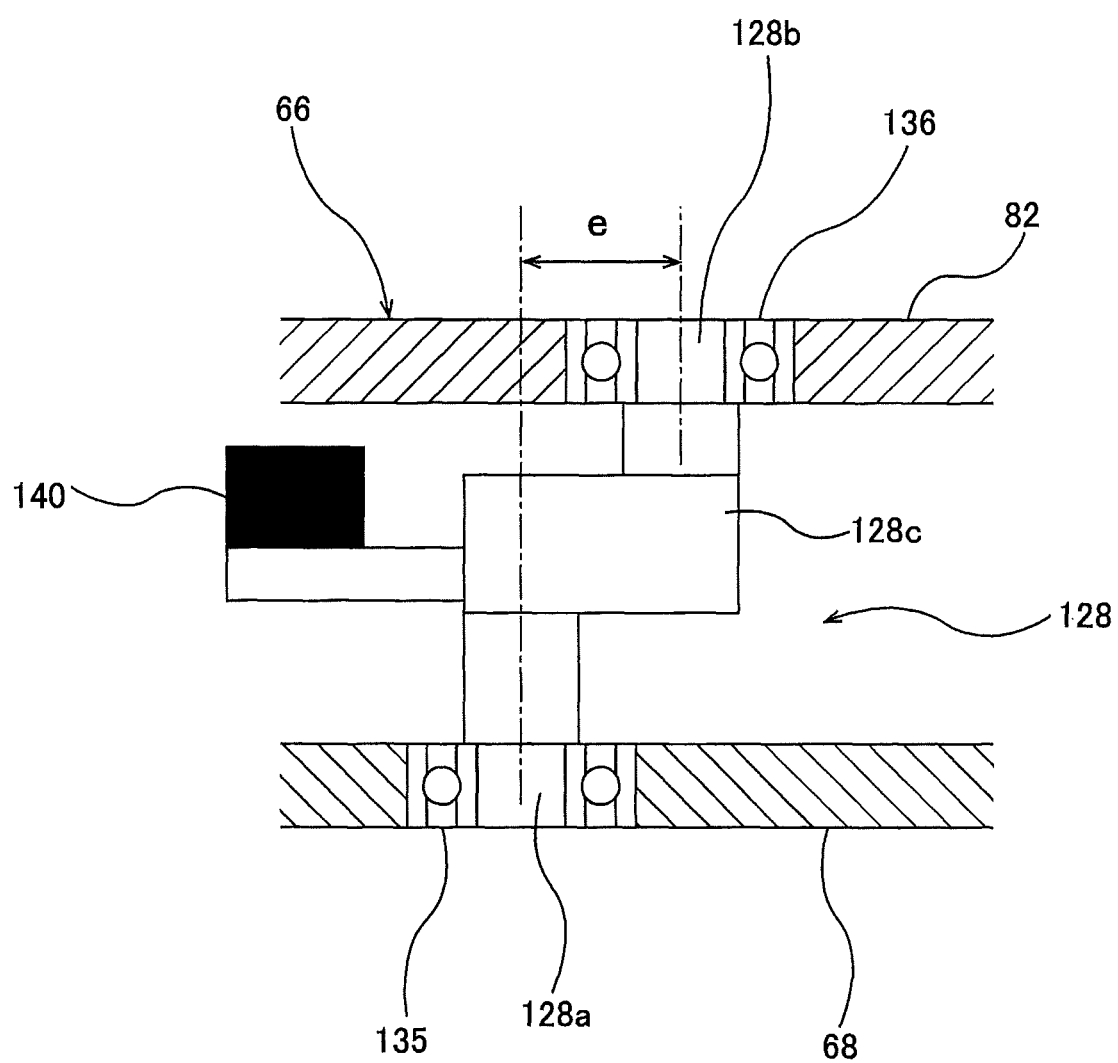
FIG. 11 is an enlarged view of one of four eccentric joints.

FIG. 11 is an enlarged view of one of the four eccentric joints 128. The other eccentric joints 128 have the same construction, and therefore a duplicate description thereof will be omitted. As shown in FIG. 11, the eccentric joint 128 includes a first joint shaft portion 128*a* rotatably coupled to the base plate 68, and a second joint shaft portion 128*b* rotatably coupled to the orbital table 66. A bearing 135 is fixed to the base plate 68, and the first joint shaft portion 128*a* is rotatably supported by the bearing 135. The orbital table 66 has a bearing 136 fixed to the pedestal 82, and the second joint shaft portion 128*b* is rotatably supported by the bearing 136.

The second joint shaft portion 128*b* is decentered by a distance e from the first joint shaft portion 128*a*. This distance e is equal to the distance e by which the second main shaft portion 121*b* of the main eccentric shaft 121 is eccentric relative to the first main shaft portion 121*a*. Accordingly, when the orbital table 66 is making a translational rotating motion, the second joint shaft portion 128*b* of the eccentric joint 128 rotates in a circular orbit with the same radius as that of the circular orbit in which the second main shaft portion 121*b* of the main eccentric shaft 121 rotates. The thus-constructed eccentric joint 128 can support the orbital table 66 while allowing the orbital table 66 to make a translational rotating motion.

A counter weight 140 is secured to the eccentric joint 128. The counter weight 140 is secured to an intermediate shaft portion 128*c* coupling the first joint shaft portion 128*a* and the second joint shaft portion 128*b*. The counter weight 140 and the second joint shaft portion 128*b* are arranged symmetrically with respect to the first joint shaft portion 128*a*. The weight of the counter weight 140 is equal to an equally-divided amount of the sum of the weight of the orbital table 66 and the weight of structures, located above the orbital table 66, of the substrate holding apparatus. Specifically the weight of the counter weight 140 is such that it can cancel a centrifugal force generated in the above structures, including the orbital table 66, by the translational rotating motion. Such counter weight 140 can prevent vibration of the above structures, including the orbital table 66, and vibration of the wafer W due to a weight imbalance during rotation of the eccentric joint 128.

The operation of the thus-constructed substrate holding apparatus is as follows. The two rotary actuators 96 move the clamp rollers 90 to the unclamping positions shown in FIG. 9. The wafer W is transported to the substrate holding apparatus by a not-shown transport device. While the wafer W is located between the drive rollers 61 and the clamp rollers 90, the rotary actuators 96 move the clamp rollers 90 to the clamping positions shown in FIG. 7. The periphery of the wafer W is held by the wafer holding surfaces 61*a* of the drive rollers 61 and the wafer holding surfaces 90*a* of the clamp rollers 90.

The first motors 71 rotate the drive rollers 61 about their own axes via the first universal joints 72 and the drive shafts 64. The rotations of the drive rollers 61 are transmitted to the wafer W, whereby the wafer W rotates about the axis of the wafer W. The clamp rollers 90 are freely rotatable. Therefore, the clamp rollers 90 are rotated by the rotation of the wafer W. The second motor 124 of the translational rotating mechanism 120 rotates the main eccentric shaft 121, thereby causing the orbital table 66 to make a translational rotating motion. The wafer W, the drive rollers 61, the clamp rollers 90, the drive shafts 64, and the eccentric shafts 93 make a translational rotating motion together with the orbital table 66.

As shown in FIG. 6, the drive shafts 64 are coupled to the first motors 71 via the first universal joints 72, and the eccentric shafts 93 are coupled to the rotary actuators 96 via the second universal joints 98. Therefore, the drive shafts 64 and the eccentric shafts 93 can make a translational rotating motion together with the orbital table 66, while the positions of the first motors 71 and the positions of the rotary actuators 96 are fixed. The first motors 71 and the rotary actuators 96, each of which have relatively heavy weight, are secured to the base plate 68, and do not make a translational rotating motion. This configuration can stabilize the translational rotating motion of the orbital table 66, and can reduce the electrical power necessary for the second motor 124 to cause the orbital table 66 to make the translational rotating motion. Further, the first motors 71 and the rotary actuators 96 are located below the base plate 68. This arrangement eliminates the need for wiring and pipe connection to those portions which make a translational rotating motion, thus making it possible to avoid the risk of breaking of wire due to long-term operation.

The rotation of the drive rollers 61 and the translational rotating motion of the orbital table 66 may be started simultaneously, or the rotation of the drive rollers 61 may be started before or after the start of the translational rotating motion of the orbital table 66. The rotational speed of the drive rollers 61 may be the same as or different from the rotational speed of the translational rotating motion of the orbital table 66. The start and stop of the rotation of the drive rollers 61, the start and stop of the translational rotating motion of the orbital table 66, the rotational speed of the drive rollers 61, and the rotational speed of the translational rotating motion of the orbital table 66 are controlled by the operation controller 134.

The substrate holding apparatus according to this embodiment can rotate the wafer W about its own axis while causing the wafer W to make a translational rotating motion. The combination of the translational rotating motion of the wafer W and the rotation of the wafer W about its axis can increase the speed of the wafer W at any point on the surface of the wafer W. Therefore, when the below-described processing head is pressed against the surface of the wafer W, the relative speed between the processing head and the surface of the wafer W can be increased, thereby increasing a processing rate of the wafer W.

Figure 12:
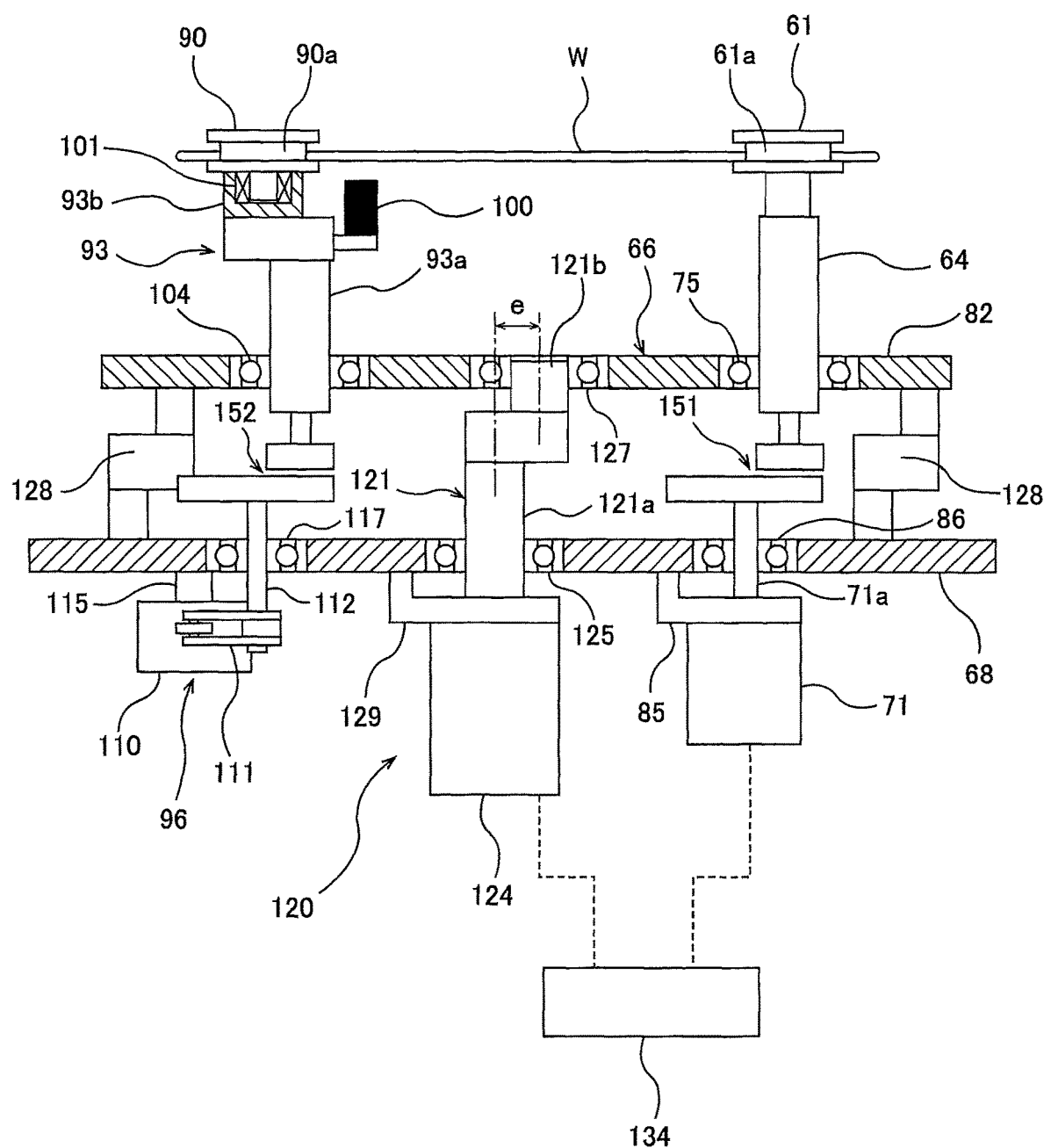
FIG. 12 is a side view showing yet another embodiment of a substrate holding apparatus.

FIG. 12 is a side view showing yet another embodiment of a substrate holding apparatus. The construction and operation of this embodiment, not particularly described here, are the same as those of the embodiment described above with reference to FIGS. 6 through 11, and therefore a duplicate description thereof will be omitted.

The substrate holding apparatus according to the embodiment shown in FIG. 12 includes two first magnet gears 151 as first torque transmitting mechanisms, and two second magnet gears 152 as second torque transmitting mechanisms. The first magnet gears 151 and the second magnet gears 152 are located between the orbital table 66 and the base plate 68. One ends of the first magnet gears 151 are coupled to the drive shafts 64, while the other ends of the first magnet gears 151 are coupled to the shafts 71a of the first motors 71. One ends of the second magnet gears 152 are coupled to the first shaft portions 93a of the eccentric shafts 93, while the other ends of the second magnet gears 152 are coupled to the rotating shafts 112 of the rotary actuators 96.

Figure 13:
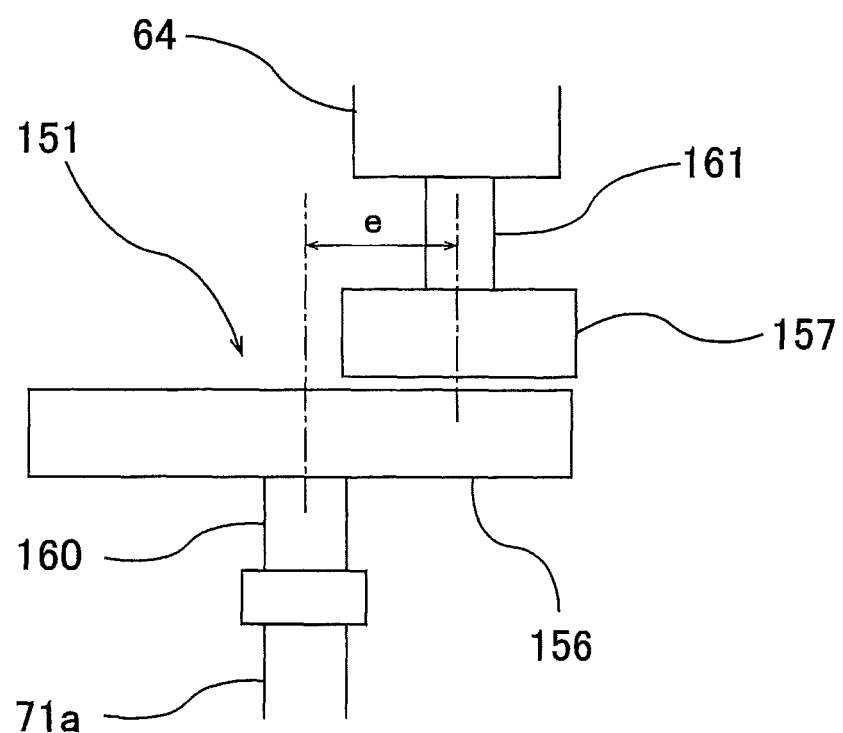
FIG. 13 is an enlarged view of a first magnet gear shown in FIG. 12.

Each first magnet gear 151 and each second magnet gear 152 have the same construction and the same size. Therefore, the construction of the first magnet gear 151 will be described below, and a description of the second magnet gear 152 will be omitted. FIG. 13 is an enlarged view of the first magnet gear 151. As shown in FIG. 13, the first magnet gear 151 includes a drive magnet rotor 156, a driven magnet rotor 157, a drive coupling shaft 160 secured to the center of the drive magnet rotor 156, and a driven coupling shaft 161 secured to the center of the driven magnet rotor 157. The drive magnet rotor 156 and the driven magnet rotor 157 face each other with a slight gap between them. A diameter of the drive magnet rotor 156 is larger than a diameter of the driven magnet rotor 157. The driven magnet rotor 157 is decentered by a distance e from the drive magnet rotor 156. The drive coupling shaft 160 is coupled to the shaft 71a of the first motor 71, while the driven coupling shaft 161 is coupled to the drive shaft 64.

Figure 14A:
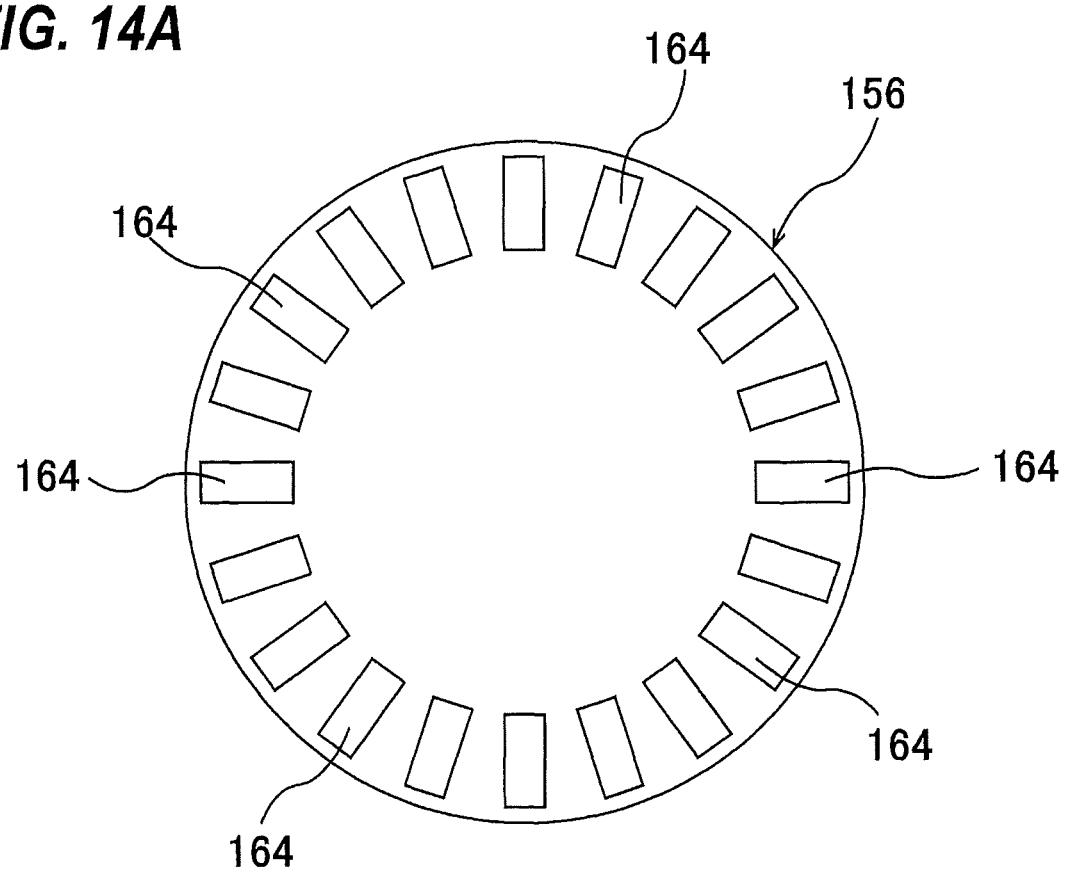
FIG. 14A is a diagram showing a drive magnet rotor.
Figure 14B:
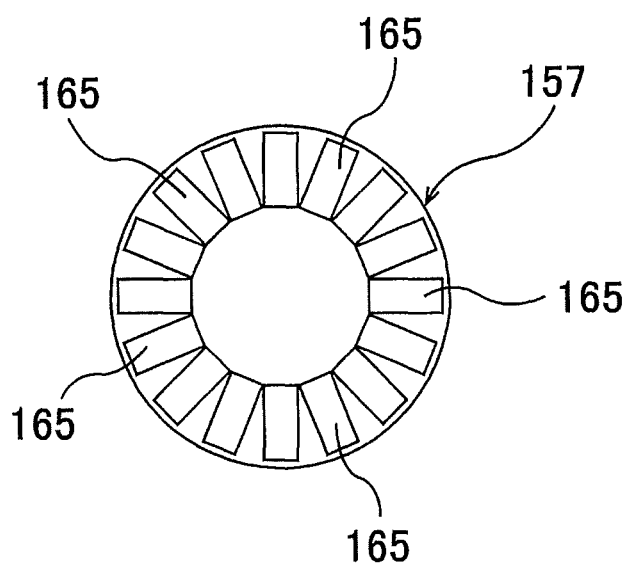
FIG. 14B is a diagram showing a driven magnet rotor.

FIG. 14A is a diagram showing the drive magnet rotor 156, and FIG. 14B is a diagram showing the driven magnet rotor 157. The drive magnet rotor 156 has a plurality of permanent magnets 164 arranged in a circle. Similarly, the driven magnet rotor 157 has a plurality of permanent magnets 165 arranged in a circle. The torque of the drive magnet rotor 156 is transmitted to the driven magnet rotor 157 by a magnetic force generated between the permanent magnets 164 of the drive magnet rotor 156 and the permanent magnets 165 of the driven magnet rotor 157.

When the driven magnet rotor 157 is making a translational rotating motion together with the drive shaft 64, the driven magnet rotor 157, while keeping facing the drive magnet rotor 156, makes a circular motion in a circumferential direction of the drive magnet rotor 156. Therefore, the torque of the drive magnet rotor 156 can be transmitted to the driven magnet rotor 157.

Figure 15:
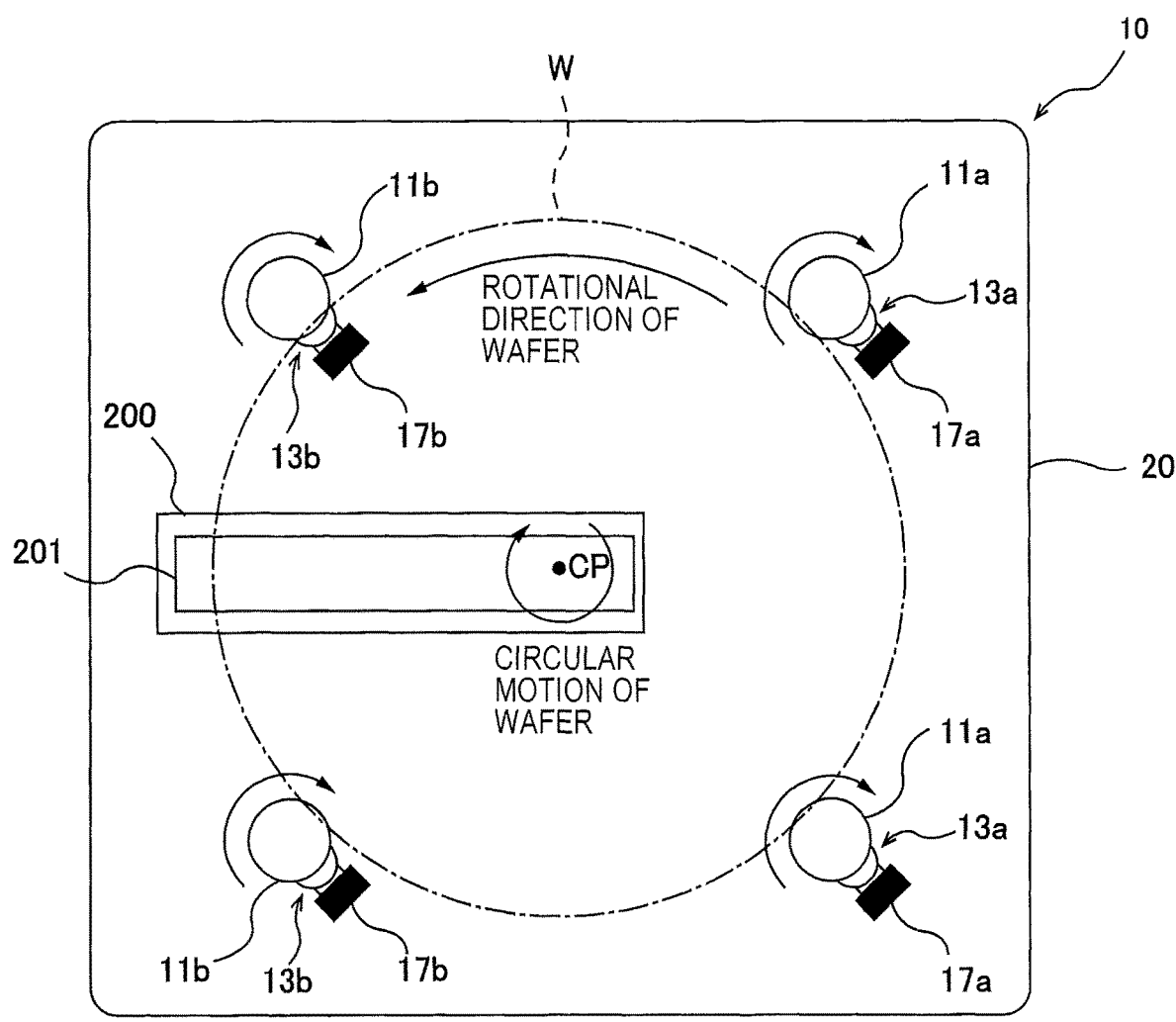
FIG. 15 is a plan view schematically showing an embodiment of a substrate processing apparatus including the substrate holding apparatus described with reference to FIGS. 1 through 5.
Figure 16:
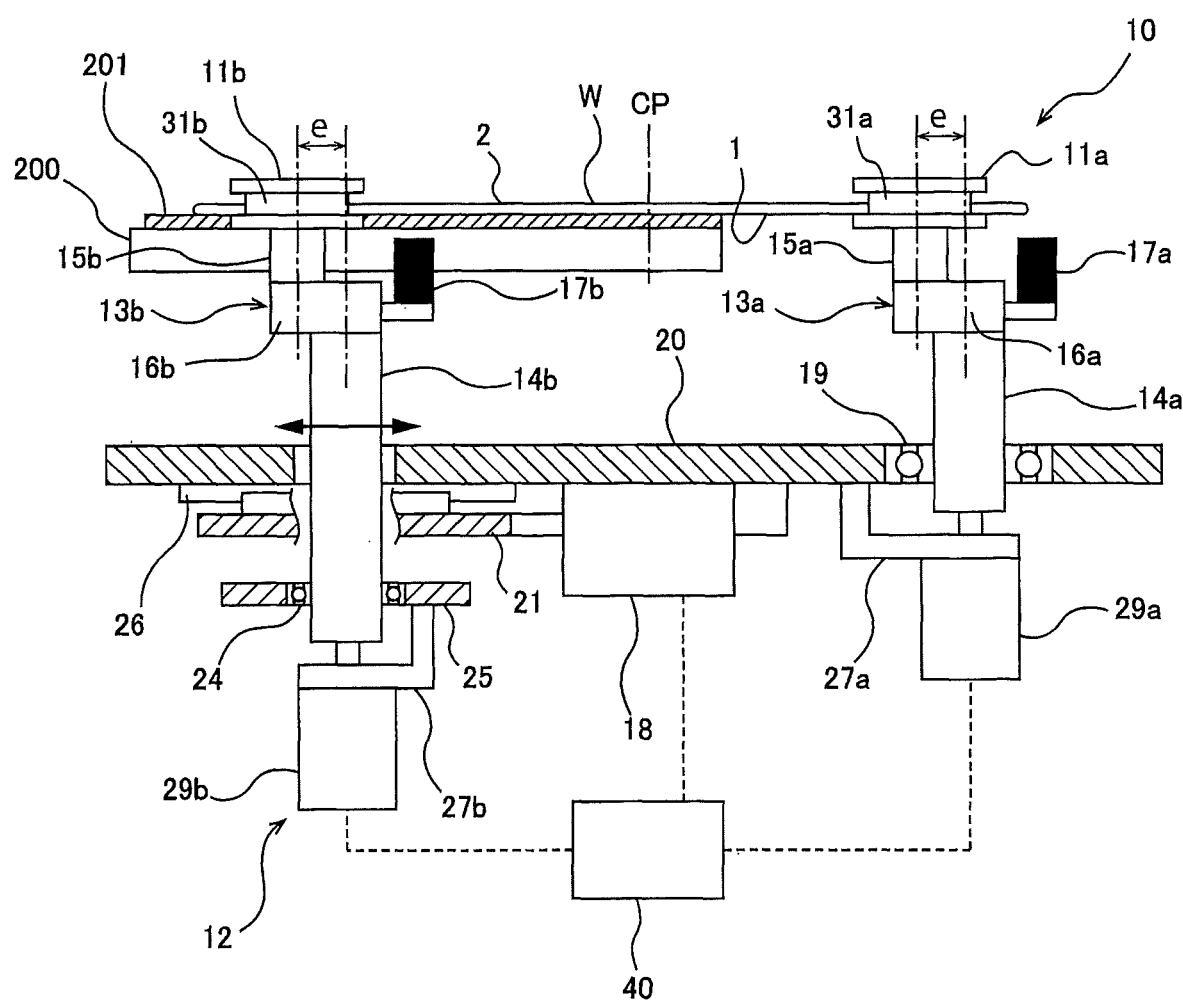
FIG. 16 is a side view of the substrate processing apparatus shown in FIG. 15.

FIG. 15 is a plan view schematically showing an embodiment of a substrate processing apparatus including the substrate holding apparatus described above with reference to FIGS. 1 through 5, and FIG. 16 is a side view of the substrate processing apparatus shown in FIG. 15. The construction and operation of this embodiment, not particularly described here, are the same as those of the embodiment described above with reference to FIGS. 1 through 5, and therefore a duplicate description thereof will be omitted. The substrate processing apparatus of this embodiment includes a substrate holding apparatus 10, and a processing head 200 for bringing a processing tool 201 into contact with a first surface 1 of a wafer W, held by the substrate holding apparatus 10, to process the first surface 1. The processing head 200 is located below the wafer W held by the substrate holding apparatus 10, and the position of the processing head 200 is fixed.

In this embodiment, the first surface 1 of the wafer W is a back surface of the wafer W, i.e. a non-device surface where no device is formed or no device is to be formed. A second surface 2 of the wafer W, which is opposite from the first surface 1, is a front surface, i.e. a device surface where a device(s) is formed or a device(s) is to be formed. In this embodiment, the wafer W, with its first surface 1 facing downward, is horizontally held by the substrate holding apparatus 10.

Detailed operation of the substrate processing apparatus of this embodiment is as follows. The substrate holding apparatus 10 brings the plurality of rollers 11a and the plurality of rollers 11b into contact with the periphery of the wafer W, and rotates the rollers 11a, 11b about their respective own axes and, in addition, causes the rollers 11a, 11b to make a circular motion, thereby rotating the wafer W about its axis and causing the wafer W to make a circular motion. While the wafer W is making the rotation and the circular motion, the processing head 200 places the processing tool 201 in contact with the first surface 1 of the wafer W to process the first surface 1.

In this embodiment, the processing tool 201 is longer than the radius of the wafer W. One end of the processing tool 201 protrudes outside the periphery of the wafer W, while the other end of the processing tool 201 extends across the axis CP of the substrate holding apparatus 10. Accordingly, the processing head 200 can bring the processing tool 201 into contact with the entirety of the first surface 1 of the rotating wafer W. This configuration enables the processing tool 201 to process the entirety of the first surface 1, including the outermost area, of the wafer W. The processing head 200 is located in such a position as not to contact the rollers 11a, 11b and the eccentric shafts 13a, 13b when the wafer W is making a circular motion.

The substrate holding apparatus according to this embodiment has a simple construction and yet can rotate the wafer W about its axis while allowing the wafer W to make a circular motion. The combination of the circular motion of the wafer W and the rotation of the wafer W about its axis can increase the speed of the wafer W at any point on the surface of the wafer W. Therefore, the relative speed between the processing tool 201 and the surface of the wafer W can be increased, thereby increasing a processing rate of the wafer W.

In one embodiment, the processing tool 201 may be a polishing tool for polishing the wafer W. Examples of the polishing tool include a polishing tape and a grindstone. In another embodiment, the processing tool 201 may be a cleaning tool for cleaning the wafer W. A cleaning tape is an example of the cleaning tool. A tape made of nonwoven fabric is an example of the cleaning tape.

In one embodiment, the substrate processing apparatus may include the substrate holding apparatus according to one of the embodiments described above with reference to FIGS. 6 through 14, instead of the substrate holding apparatus described above with reference to FIGS. 1 through 5. The construction and operation of the substrate holding apparatus 10 are the same as those of one of the embodiments described above with reference to FIGS. 6 through 14, and therefore a duplicate description thereof is omitted.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate holding apparatus for holding a substrate and rotating the substrate, comprising:
   rollers capable of contacting a periphery of the substrate;

a roller rotating mechanism configured to rotate the rollers; and eccentric shafts coupling the rollers and the roller rotating mechanism, the eccentric shafts having first shaft portions, intermediate shaft portions, and second shaft portions, the second shaft portions being eccentric relative to the first shaft portions, the first shaft portions being secured to the roller rotating mechanism, the rollers being fixed to the second shaft portions, respectively, the intermediate shaft portions being connected between the first shaft portions and the second shaft portions, wherein the first shaft portion is connected on a bottom surface of the intermediate shaft portion, the second shaft portion is connected on a top surface of the intermediate shaft portion, and a central axis of each second shaft portion being located apart from a rotating axis of each first shaft portion, and each second shaft portion being configured to be rotatable 360 degrees around each first shaft portion.

2. The substrate holding apparatus according to claim 1, wherein the roller rotating mechanism includes motors coupled to the first shaft portions, respectively, and an operation controller configured to instruct the motors to rotate the first shaft portions, the second shaft portions, and the intermediate shaft portions in the same direction, at the same speed and in the same phase.

3. The substrate holding apparatus according to claim 1, further comprising counter weights secured to the eccentric shafts, respectively, each of the counter weights and corresponding one of the rollers being arranged symmetrically with respect to corresponding one of the first shaft portions.

4. A substrate processing apparatus comprising:
   the substrate holding apparatus according to claim 1; and
   a processing head for bringing a processing tool into contact with a first surface of a substrate to process the first surface.

5. The substrate processing apparatus according to claim 1 wherein the first shaft portion is connected at an offset to a geometric center on a bottom surface of the intermediate shaft portion, the second shaft portion is connected at an offset to a geometric center on a top surface of the intermediate shaft portion.

6. The substrate processing apparatus according to claim 5 wherein the offset to a geometric center on a bottom surface and the offset to a geometric center on a bottom surface are not aligned with each other.

* * * * *